(12) United States Patent
Zalivaka et al.

(10) Patent No.: US 11,635,916 B2
(45) Date of Patent: Apr. 25, 2023

(54) WORKLOAD-AWARE MEMORY CONTROLLER BASED ON COMPACT WORKLOAD REPRESENTATION AND METHOD THEREOF

(71) Applicant: SK hynix Inc., Gyeonggi-do (KR)

(72) Inventors: Siarhei Zalivaka, Minsk (BY);
Alexander Ivaniuk, Minsk (BY)

(73) Assignee: SK hynix Inc., Gyeonggi-do (KR)

( * ) Notice: Subject to any disclaimer, the term of this patent is extended or adjusted under 35 U.S.C. 154(b) by 9 days.

(21) Appl. No.: 17/216,934

(22) Filed: Mar. 30, 2021

(65) Prior Publication Data

US 2022/0326876 A1   Oct. 13, 2022

(51) Int. Cl.
*G06F 3/06* (2006.01)
*G06F 11/30* (2006.01)
*G06F 11/34* (2006.01)

(52) U.S. Cl.
CPC ............ *G06F 3/0659* (2013.01); *G06F 3/064* (2013.01); *G06F 3/0619* (2013.01); *G06F 3/0652* (2013.01); *G06F 3/0679* (2013.01); *G06F 11/3034* (2013.01); *G06F 11/3414* (2013.01)

(58) Field of Classification Search
CPC ...... G06F 3/0659; G06F 3/0619; G06F 3/064; G06F 3/0652; G06F 3/0679; G06F 11/3034; G06F 11/3414
See application file for complete search history.

(56) References Cited

U.S. PATENT DOCUMENTS

| | | |
|---|---|---|
| 10,346,431 B1 | 7/2019 | Broda et al. |
| 10,871,966 B2 | 12/2020 | Chen et al. |
| 2019/0303043 A1 | 10/2019 | Charnevich et al. |
| 2022/0138562 A1* | 5/2022 | Biryukova ........... G06N 3/0481 706/15 |
| 2022/0147818 A1* | 5/2022 | Zhang .................. G06N 3/0454 |

OTHER PUBLICATIONS

McIntyre D., Annual Flash Controller Update, Flash Memory Summit 2019, Santa Clara, CA.
Seo B. et al., IO Workload Characterization Revisited: A Data-Mining Approach, IEEE Transactions on Computers, Dec. 2014, pp. 3026-3038, vol. 63, No. 12.
Chung J. et al., Empirical Evaluation of Gated Recurrent Neural Networks on Sequence Modeling, Dec. 2014, vol. 1.

(Continued)

*Primary Examiner* — Hiep T Nguyen
(74) *Attorney, Agent, or Firm* — IP & T Group LLP

(57) ABSTRACT

Compact representation for input workloads is generated in a memory system, A memory controller includes firmware (FW) and an encoder including recurrent encoding blocks. Each recurrent encoding block receives one of input commands in an input workload, and generates a hidden state vector corresponding to the received input command by applying a set of activation functions on the received input command. The last encoding block generates a final hidden state vector as a compact representation vector corresponding to the input commands. The firmware determines a distance function between the compact representation vector and each of multiple compact workload vectors and tunes at least one of firmware parameters based on the determined distances.

20 Claims, 11 Drawing Sheets

(56) References Cited

OTHER PUBLICATIONS

Chang A X M et al., Recurrent Neural Networks Hardware Implementation on FPGA, Mar. 2016, vol. 4.
Mikolov T et al., Linguistic Regularities in Continuous Space Word Representations, 2013, pp. 746-751, Association for Computational Linguistics.
Srivastava et al., Unsupervised Learning of Video Representations Using LSTMs, 2015, vol. 37.
Maaten L.V.D. et al., Visualizing Data using t-SNE, Journal of Machine Learning Research 9, 2008, pp. 2579-2605.

\* cited by examiner

WORKLOAD-AWARE MEMORY CONTROLLER BASED ON COMPACT WORKLOAD REPRESENTATION AND METHOD THEREOF

BACKGROUND

1. Field

Embodiments of the present disclosure relate to a scheme for analyzing workloads in a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems may perform operations associated with one or more workloads from a host. Workload analysis becomes important for performance and reliability improvements in memory systems. In this context, embodiments of the invention arise.

SUMMARY

Aspects of the present invention include a system including a memory controller capable of being aware of compact representation of input workloads and a method thereof.

In one aspect, a system includes a memory device; and a controller including an encoder and firmware (FW) coupled to the encoder including a plurality of recurrent encoding blocks, which include first to last encoding blocks. Each recurrent encoding block is configured to: receive one of a plurality of input commands in an input workload associated with the memory device; and generate a hidden state vector corresponding to the received input command by applying a set of activation functions on the received input command. The last encoding block generates a final hidden state vector as a compact representation vector corresponding to the plurality of input commands. The firmware is configured to: determine a distance function between the compact representation vector and each of multiple compact workload vectors; and tune at least one of firmware parameters based on the determined distances.

In another aspect, a method for operating a controller of a memory system includes: providing an encoder and firmware (FW) coupled to the encoder including a plurality of recurrent encoding blocks, which includes first to last encoding blocks; receiving, by each recurrent encoding block, one of a plurality of input commands in an input workload associated with a memory device; generating, by each recurrent encoding block, a hidden state vector corresponding to the received input command by applying a set of activation functions on the received input command; determining, by the firmware, a distance function between a compact representation vector corresponding to the plurality of input commands and each of multiple compact workload vectors; and tuning, by the firmware, at least one of firmware parameters based on the determined distances. The last encoding block generates a final hidden state vector as a compact representation vector.

Additional aspects of the present invention will become apparent from the following description.

DETAILED DESCRIPTION

Figure 1:
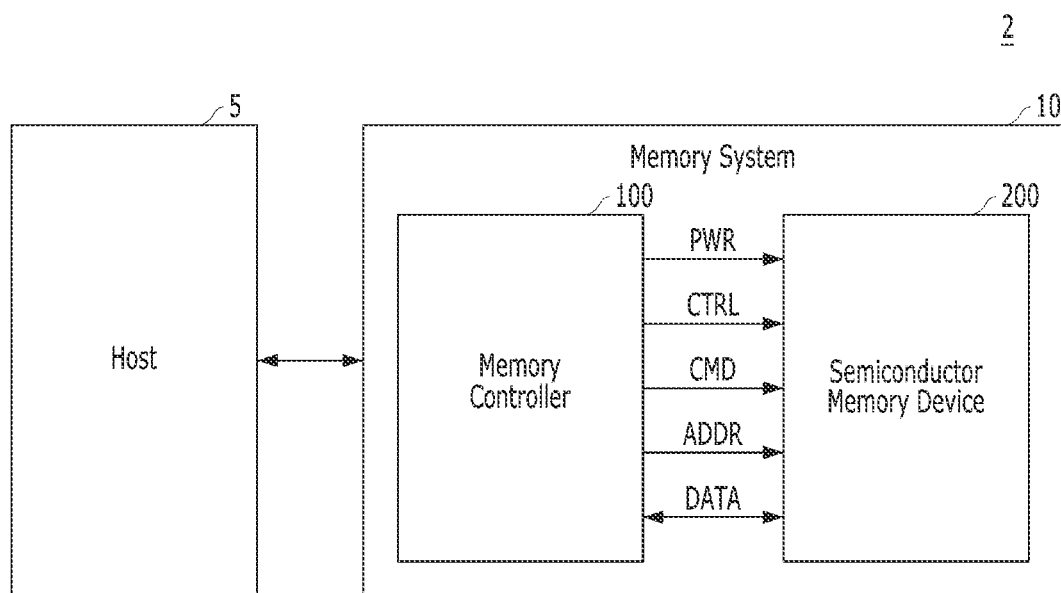
FIG. 1 is a block diagram illustrating a data processing system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any of various types of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any of various types of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operation of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
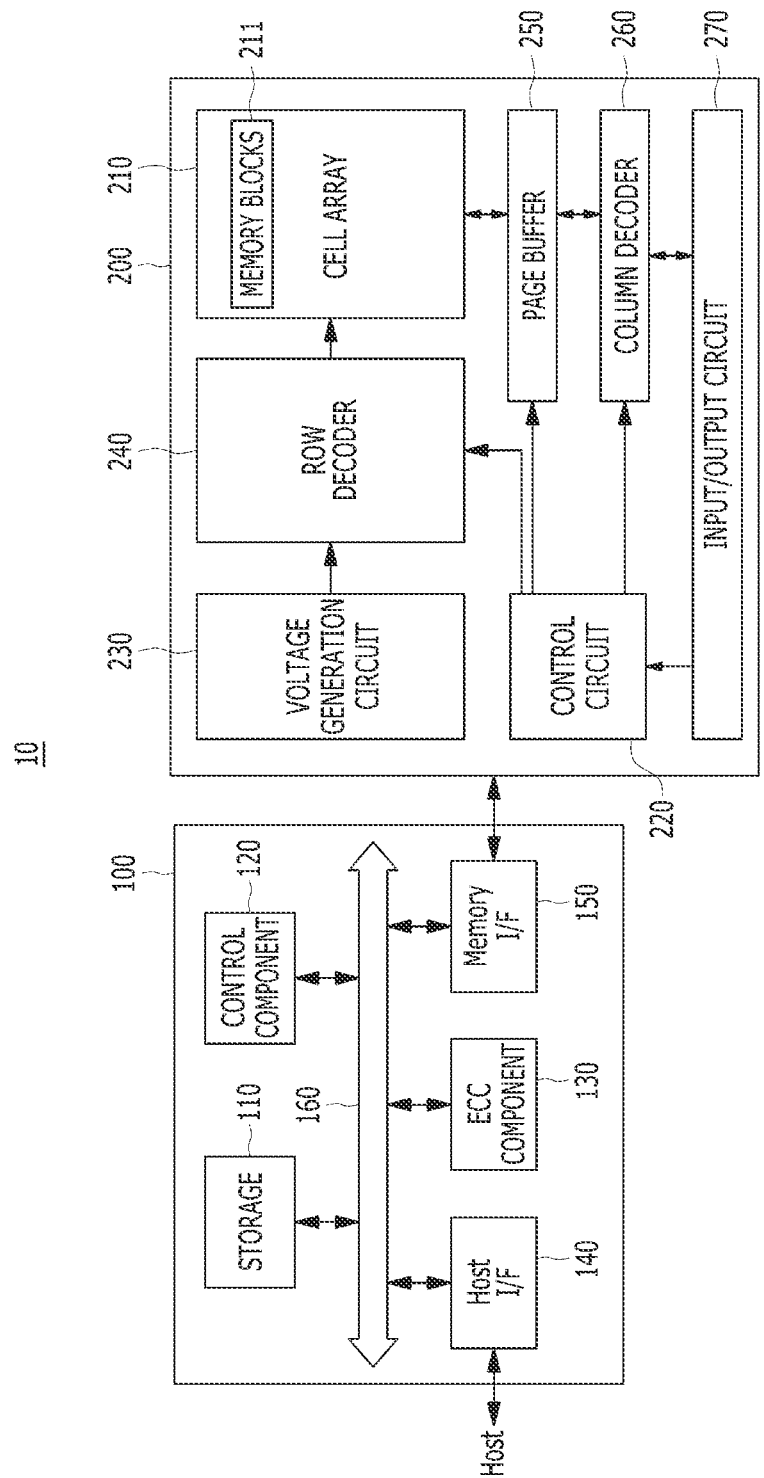
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operation of the memory system 10, and in particular a write operation and a read operation for the memory device 200 in response to a corresponding request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and/or an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250 which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation on the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
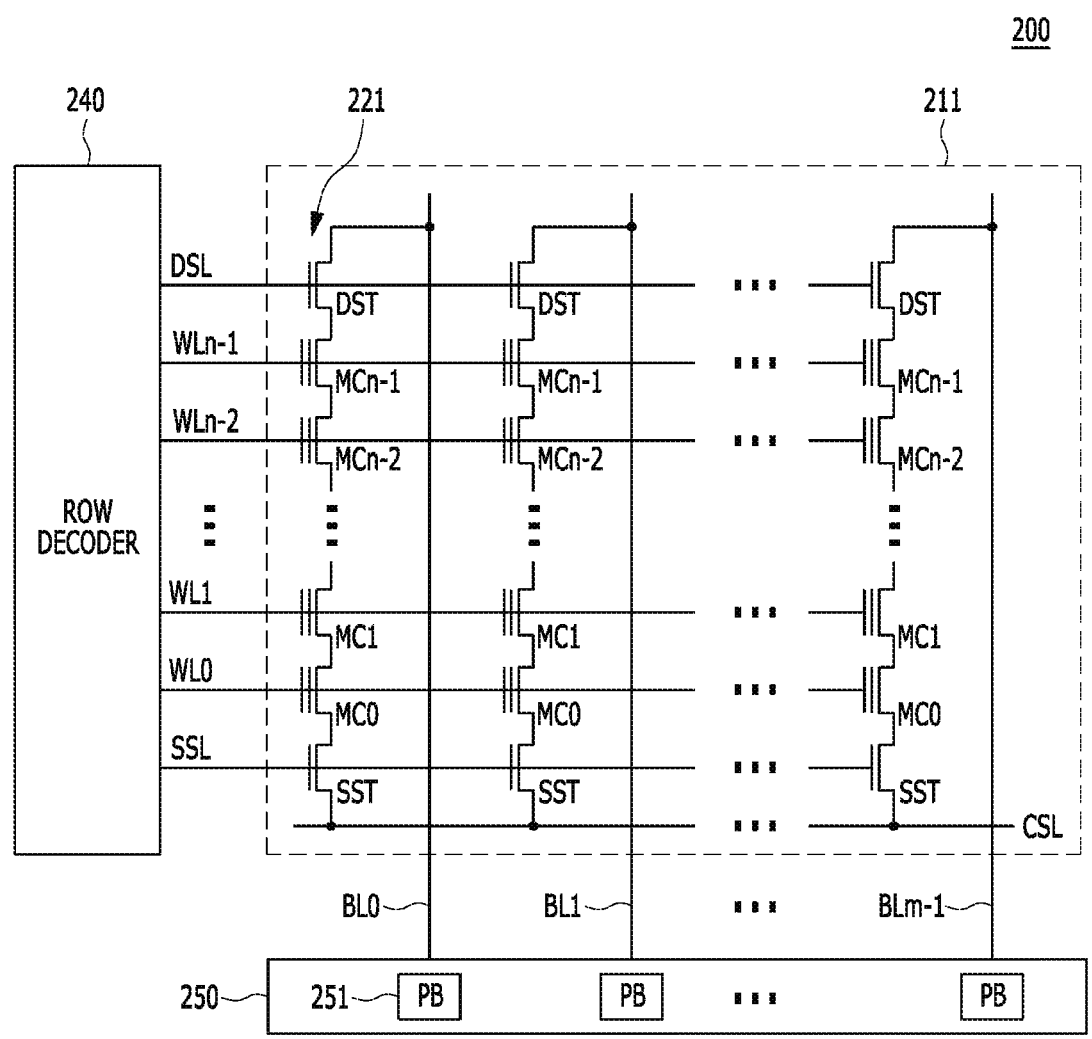
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the memory block 211 may include a plurality of word lines WL0 to WLn−1, a drain select line DSL and a source select line SSL coupled to the row decoder 240. These lines may be arranged in parallel, with the plurality of word lines between the DSL and SSL.

The memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a single level cell (SLC) storing 1 bit of data, a multi-level cell (MLC) storing 2 bits of data, a triple-level cell (TLC) storing 3 bits of data, or a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 may temporarily store data received through the bit lines BL0 to BLm−1 or sense voltages or currents of the bit lines during a read or verify operation.

In some embodiments, the memory blocks 211 may include NAND-type flash memory cells. However, the memory blocks 211 are not limited to such cell type, but may include NOR-type flash memory cells. Memory cell array 210 may be implemented as a hybrid flash memory in which two or more types of memory cells are combined, or one-NAND flash memory in which a controller is embedded inside a memory chip.

Figure 4:
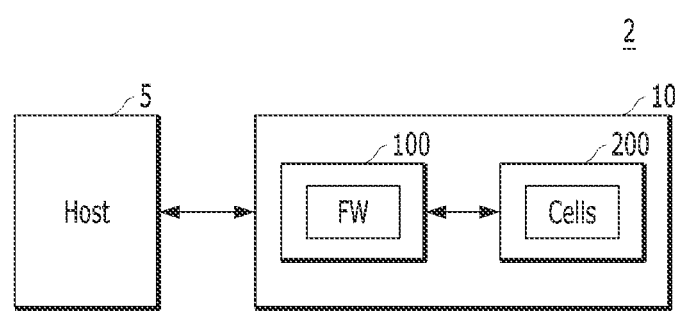
FIG. 4 is a diagram illustrating a data processing system in accordance with an embodiment of the present invention.

FIG. 4 is a diagram illustrating a data processing system 2 in accordance with an embodiment of the present invention.

Referring to FIG. 4, the data processing system 2 may include a host 5 and a memory system 10. The memory system 10 may include a controller 100 and a memory device 200. The controller 100 may include a flash translation layer (FTL) which is an intermediate system made up software and hardware that manages operation of the memory system 10. The functionalities of FTL may be integrated into either firmware (FW) or file system. Firmware is a specific class of software for controlling various operations (e.g., read, write, and erase operations) for the memory device 200. In some embodiments, the firmware may reside in the storage 110 and may be executed by the control component 120, in FIG. 2.

The memory device 200 may include a plurality of memory cells (e.g., NAND flash memory cells). The memory cells are arranged in an array of rows and columns as shown in FIG. 3. The cells in a particular row are connected to a word line (e.g., WL0), while the cells in a particular column are coupled to a bit line (e.g., BL0). These word and bit lines are used for read and write operations. During a write operation, the data to be written ('1' or '0') is provided at the bit line while the word line is asserted. During a read operation, the word line is again asserted, and the threshold voltage of each cell can then be acquired from the bit line. Multiple pages may share the memory cells that belong to (i.e., are coupled to) the same word line.

In the memory system 10, the controller 100 may perform operations associated with one or more workloads from the host 5. Workloads may be defined as data streams (or commands) generated by applications of the host 5 that are seen by the memory system 10 as a collection of access patterns. The memory system 10 may be implemented with a solid state drive (SSD). SSDs will take around 85% of enterprise storage capacities by 2026 according to the report: David McIntyre "Annual Flash Controller Update," Flash Memory Summit 2019 Proceedings (FMS'19). Flash-based storage is also more beneficial in terms of cost per bit compared to hard disk drives (HDDs). However, due to the limited number of erase/write (EW) cycles and complicated logical to physical (L2P) mapping, flash memory devices in an SSD are much more sensitive to changes of input workload. Therefore, workload analysis becomes important for performance and reliability improvements in flash memory devices (e.g., NAND flash memories).

The workload for SSDs is not limited only to spatial characteristics (i.e., random or sequential access patterns), therefore it may be described using multiple features which are determined based on the developers' experience. For example, the workload analysis process may rely on multiple features such as the number of commands and their duration, characteristics of access segments, input and output requests, intervals between requests, etc. However, even the most exhaustive set of features might not take into account important workload characteristics. Also, some of the features might be irrelevant to the flash translation layer (FTL) algorithms and should be excluded from consideration.

Since real workloads are usually unknown, the first step of workload analysis may be clustering, i.e., separation workloads into different types (i.e., clusters). The next step of workload analysis may be to make a flash translation layer (FTL) aware of workloads. Usually, FTL algorithms and policies (e.g., wear leveling, garbage collection, error protection, etc.) for random write-only and sequential read-only workloads should be different. For this, the types of workloads should be detected and recognized based on a sequence of input commands. One implementation of workload detectors is described in U.S. Pat. No. 10,802,761 B2, entitled "WORKLOAD PREDICTION IN MEMORY SYSTEM AND METHOD THEREOF." As such, it is necessary to provide a scheme to make an FTL aware of input workloads and optimize its performance based on the awareness of input workloads. Accordingly, embodiments provide a scheme for a compact representation of input workloads in a memory system (e.g., SSD such as NAND flash memory devices) and a memory controller capable of being aware of input workloads based on a compact representation for input workloads. Thus, embodiments may optimize performance and/or reliability of a memory system.

In accordance with embodiments, the controller 100 of FIG. 4 may provide a coder (i.e., encoder and decoder) for compact representation of an input workload, and an encoding and decoding method thereof. Since workload can be represented as a time series and further considered as sequential data, recurrent neural networks are supposed to be efficient in processing this data. Also, the internal representation of the workload should be compact to be stored in a storage (e.g., volatile memory). Therefore, embodiments provide compact workload representation based on a recurrent neural network model and a recurrent neural network (RNN) autoencoder has been used as a model to represent input workload, i.e., a coder including an encoder and a decoder. The quality of the model depends on the diversity and the size of a training set. Introductions of the recurrent neural network model and the recurrent neural network (RNN) autoencoder are described in: T. Mikolov et. al., "Linguistic Regularities in Continuous Space Word Representation," Proceedings of the 2013 Conference of the North American Chapter of Association for Computational Linguistics, pp. 746-751; and N. Srivastava et. al., "Unsupervised Learning of Video Representations Using LSTMs," Proceedings of the 32nd international Conference on Machine Learning, PMLR 37:843-852, 2015, which are incorporated by references herein in their respective entireties. Compact representation of the input workload is helpful for FTL reconfiguration and more precise FW parameters tuning. If the data set for training is wide and diverse, embodiments would be able to detect many types of different workloads.

Figure 5:
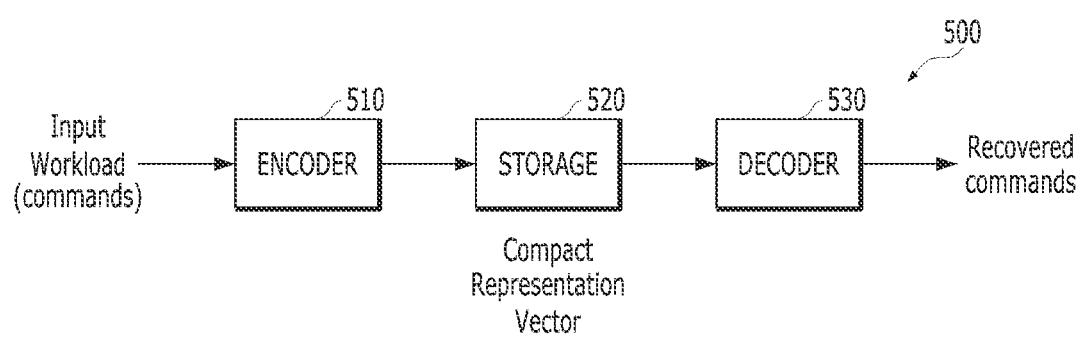
FIG. 5 is a diagram illustrating a recurrent neural network coder in accordance with an embodiment of the present invention.

FIG. 5 is a diagram illustrating a recurrent neural network coder 500 in accordance with an embodiment of the present invention. In some cases, the recurrent neural network coder 500 may provide compact workload representation and be referred to as recurrent neural network (RNN) autoencoder.

Referring to FIG. 5, the recurrent neural network coder 500 may include an encoder 510, a storage 520 and a decoder 530. The encoder 510 may receive input workload including a plurality of input commands associated with a memory device (e.g., the memory device 200 of FIG. 4.) For example, the input workload is received from a host 5 of FIG. 4. In some embodiments, the workload may be represented as time series including N commands $C_1$ to $C_N$. Each command $C_i$ (where $1 \le i \le N$) may have at least two features, namely Type of a command ($T_i$), Logic Block Address ($LBA_i$). Features are not limited to the two features above. $T_i$ is an integer number corresponding to possible commands. For example, $T_i$ may have a value of 0 for read command, a value of 1 for write command, and a value of 2 for erase command. $LBA_i$ is also an integer number from a range of possible addresses. For example, $LBA_i$ may be an integer number from a range from 0 to $2^{32}-1$.

The encoder 510 may generate a compact representation vector corresponding to the plurality of input commands using a set activation functions. The storage 520 may be coupled to the encoder 510 and may store the compact representation vector. The decoder 530 may be coupled to the storage 520 and may receive the compact representation vector from the storage 520. The decoder 530 may generate recovered commands based on the compact representation vector and the plurality of input commands. Details of the encoder 510, the storage 520 and the decoder 530 are described with reference to FIGS. 6A to 7 below.

Figure 6A:
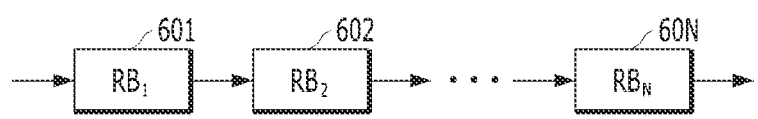
FIG. 6A is a diagram illustrating a plurality of recurrent blocks in accordance with an embodiment of the present invention.

Each of the encoder 510 and the decoder 530 may be implemented with a plurality of recurrent blocks 601-60N including a first recurrent block $RB_1$ to an Nth recurrent block $RB_N$ as shown in FIG. 6A. The first recurrent block $RB_1$ to the Nth recurrent block $RB_N$ are connected in cascade.

Figure 6B:
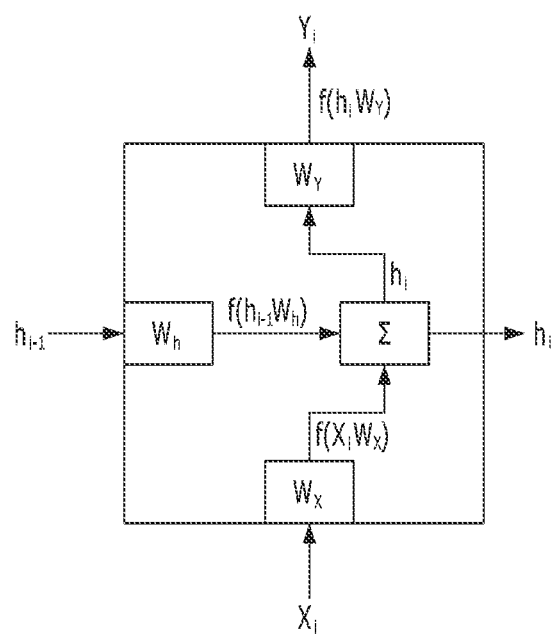
FIG. 6B is a diagram illustrating a recurrent block in accordance with an embodiment of the present invention.

FIG. 6B is a diagram illustrating a general structure of a recurrent block in FIG. 6A.

Referring to FIG. 6B, a recurrent block RB with index i ($RB_i$) has two inputs and two outputs. Two inputs include a hidden state vector $h_{i-1}$ which corresponds to a hidden state of previous unit $RB_{i-1}$ and an input command vector $X_i$ which corresponds to an element of an input sequence. Two outputs include a hidden state vector $h_i$ which corresponds to a hidden state of the $RB_i$ and an output vector $Y_i$ which corresponds to an output value of $RB_i$. In some embodiments, vector $X_i$ corresponds to commands of input workload and vector $Y_i$ corresponds to the recovered or predicted commands for the input workload. Each RB shares three weight matrices $W_Y$, $W_h$ and $W_X$. The outputs of RB are computed as shown in List1:

List1:

1. $X_i W_X$;
2. $f(X_i W_X)$, where f is an activation function
3. $h_{i-1} W_h$;
4. $f(h_{i-1} W_h)$, activation function may differ from the previous one;
5. $h_i = f(f(X_i W_X) + f(h_{i-1} W_h))$ - hidden state;
6. $h_i W_Y$;
7. $Y_i = f(h_i W_Y)$ - recovered or predicted command;

Referring to List1, an activation function $f(X_i W_X)$ on a combination $X_i W_X$ of a first input command $X_i$ and a first weight matrix $W_X$ is performed to generate a first vector. In some embodiments, the activation function includes one of hyperbolic tangent function $$f(x) = \tanh x = \frac{e^x - e^{-x}}{e^x + e^{-x}},$$

sigmoid function $$S(x) = \frac{1}{1+e^{-x}} = \frac{e^x}{e^x+1}$$

and rectified linear unit (ReLU) function $f(x)=x^+=\max(0, x)$.

The activation function $f(h_{i-1} W_h)$ on a combination of a previous hidden state vector $h_{i-1}$ and a second weight matrix $W_h$ is performed to generate a second vector. In some embodiments, the activation function herein may be different from the previous activation function.

The activation function $f(f(X_i W_X)+f(h_{i-1} W_h))$ on a sum of the first and second vectors $f(X_i W_X)+f(h_{i-1} W_h)$ may be performed to generate a hidden state vector $h_i$.

The activation function $f(h_i W_Y)$ on a combination of the hidden state vector $h_i$ and a third weight matrix $W_Y$ may generate an output vector $Y_i=f(h_i W_Y)$.

In some embodiments, the described RB may be implemented in different ways including a gated recurrent unit (GRU) and/or long short-term memory (LSTM) as described in J. Chung et. al., "Empirical Evaluation of Gated Recurrent Neural Networks on Sequence Modeling," NIPS 2014 Workshop on Deep Learning, December 2014.

Figure 7:
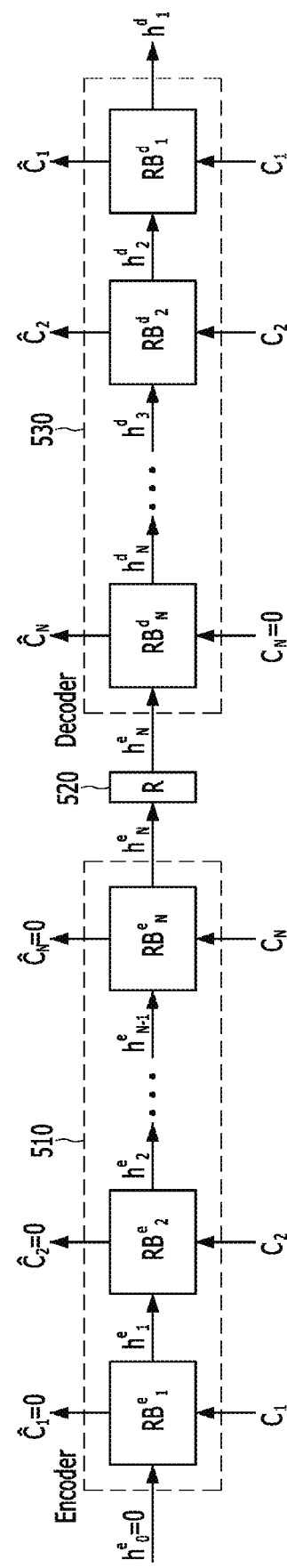
FIG. 7 is a diagram illustrating details of a recurrent neural network coder of FIG. 5.

FIG. 7 is a diagram illustrating details of a recurrent neural network coder of FIG. 5.

Referring to FIG. 7, the recurrent neural network coder may include an encoder 510, a storage 520 and a decoder 530 and be implemented with 2N recurrent blocks (RBs) in order to generate a compact representation vector R from the input workload.

The encoder 510 may learn an internal representation vector R of a workload including N commands $C_1$-$C_N$. In some embodiments, some of the workloads may be shorter or longer than N commands, therefore the workload should be either padded (i.e., extra dummy commands are added to the workload) or clipped (i.e., last commands are removed from the workload). The workload may be transformed into the compact representation R using N recurrent blocks (RBs) with weight matrices $W^e_X$, $W^e_h$, $W^e_Y$. Each RB may receive two inputs (i.e., a previous hidden state vector $h^e_{i-1}$ from a previous recurrent block and command $C_i$) and may output two values (i.e., command $\hat{C}_i$ and a weighted hidden state vector $h^e_i$). Matrix $W^e_Y$ may be not trainable as the encoder 510 accumulates the information from the input workload and does not predict or recover any commands. As a result, output commands are always equal to zero vectors.

In the illustrated example of FIG. 7, the encoder 510 may include a plurality of recurrent encoding blocks $RB^e_1$-$RB^e_N$. Each recurrent encoding block is configured to receive one $C_i$ of the plurality of input commands, and generate a hidden state vector $h^e_i$ corresponding to the received input command by applying the set of activation functions f on the received input command. The last encoding block $RB^e_N$ among the plurality of recurrent encoding blocks may generate a final hidden state vector $h^e_N$ as the compact representation vector R.

The first encoding block $RB^e_1$ is configured to: receive a first input command $C_1$ among the plurality of input commands; perform the activation function $f$ on a combination of the first input command $C_1$ and a first weight matrix $W^e_X$ to generate a first vector $f(C_1 W^e_X)$; perform the activation function on a combination of an initial hidden state vector $h^e_0$ and a second weight matrix $W^e_h$ to generate a second vector $f(h^e_0 W^e_h)$; perform the activation function on a sum of the first and second vectors to generate a first hidden state vector $h^e_1$; and perform the activation function on a combination of the first hidden state vector $h^e_1$ and a third weight matrix $W^e_Y$ to generate a first output vector $\hat{C}_1$. In some embodiments, the initial hidden state vector $h^e_0$ may have a value of 0 and the first output vector $\hat{C}_1$ may have a value of 0.

The second encoding block $RB^e_2$ is configured to: receive a second input command $C_2$ among the plurality of input commands; perform the activation function $f$ on a combination of the second input command $C_2$ and the first weight matrix $W^e_X$ to generate a third vector $f(C_2 W^e_X)$; perform the activation function on a combination of the first hidden state vector $h^e_1$ and the second weight matrix $W^e_h$ to generate a fourth vector $f(h^e_1 W^e_h)$; perform the activation function on a sum of the third and fourth vectors to generate a second hidden state vector $h^e_2$; and perform the activation function on a combination of the second hidden state vector $h^e_2$ and the third weight matrix $W^e_Y$ to generate a second output vector $\hat{C}_2$. In some embodiments, the second output vector $\hat{C}_2$ may have a value of 0.

Remaining encoding blocks among the plurality of recurrent encoding blocks may perform operations similar to the first encoding block $RB^e_1$ and the second encoding block $RB^e_2$. The last encoding block $RB^e_N$ among the plurality of recurrent encoding blocks may generate a final hidden state vector $h^e_N$ as the compact representation vector R. The compact representation vector R may be stored in the storage 520. In some embodiments, the storage 520 may be a volatile memory such as a random access memory (RAM).

The decoder 530 may receive the compact representation vector R from the storage 520 and generate recovered commands $\hat{C}_1$-$\hat{C}_N$ based on the compact representation vector R and the plurality of input commands $C_1$-$C_N$. The decoder 530 may recover workload commands $\hat{C}_1$, $\hat{C}_2$, ..., $\hat{C}_N$, which may not be exactly the same as the original workload. The structure of the decoder 530 may be symmetric to the encoder 510 but have a cascade connection structure in the opposite order in terms of input commands. The decoder 530 may process the compact representation vector R with N RB units with weight matrices $W^d_X$, $W^d_h$, $W^d_Y$, but in descending order from the last to the first commands. That is, the last decoding block $RB^d_N$ among the plurality of decoding blocks $RB^d_1$-$RB^d_N$ may be positioned in the first position of the decoder 530 and the first decoding block $RB^d_1$ may be positioned in the last position of the decoder 530. In some embodiments, the first input command $C_N$ may be the same as a zero vector as this command should be recovered from the compact representation vector R. In some embodiments, weight matrices $W^d_X$, $W^d_h$, $W^d_Y$ are the same as or different from weight matrices $W^e_X$, $W^e_h$, $W^e_Y$, respectively.

In the illustrated example of FIG. 7, the last decoding block $RB^d_N$ is configured to: receive a last input command $C_N$ among the plurality of input commands $C_1$-$C_N$ and the compact representation vector R; perform the activation function f on a combination of the last input command $C_N$ and a first weight matrix $W^d_X$ to generate a first vector $f(C_N W^d_X)$; perform the activation function on a combination of the compact representation vector R as an input hidden state vector $h^e_N$ and a second weight matrix $W^d_h$ to generate a second vector $f(h^e_N W^d_h)$; perform the activation function on a sum of the first and second vectors to generate a last hidden state vector $h^d_N$; and perform the activation function on a combination of the last hidden state vector $h^d_N$ and a third weight matrix $W^d_Y$ to generate a last output vector $\hat{C}_N$.

The second decoding block $RB^d_2$ is configured to: receive a second input command $C_2$ among the plurality of input commands $C_1$-$C_N$; perform the activation function f on a combination of the second input command $C_2$ and the first weight matrix $W^d_X$ to generate a third vector $f(C_2 W^d_X)$; perform the activation function on a combination of a second hidden state vector $h^d_3$, which is received from a third decoding block $RB^d_3$, and the second weight matrix $W^d_h$ to generate a fourth vector $f(h^d_3 W^d_h)$; perform the activation function on a sum of the third and fourth vectors to generate a second hidden state vector $h^d_2$; and perform the activation function on a combination of the second hidden state vector and the third weight matrix to generate a second output vector $\hat{C}_2$.

The first decoding block $RB^d_1$ is configured to: receive a first input command $C_1$ among the plurality of input commands $C_1$-$C_N$; perform the activation function f on a combination of the first input command $C_1$ and the first weight matrix $W^d_X$ to generate a fifth vector $f(C_1 W^d_X)$; perform the activation function on a combination of a second hidden state vector $h^d_2$, which are received from the second decoding block $RB^d_2$, and the second weight matrix $W^d_h$ to generate a sixth vector $f(h^d_2 W^d_h)$; perform the activation function on a sum of the fifth and sixth vectors to generate a first hidden state vector $h^d_1$; and perform the activation function on a combination of the first hidden state vector and the third weight matrix to generate a first output vector $\hat{C}_1$.

The model of the RNN coder in FIG. 7 may be trained using a data set containing M workloads, which may have different characteristics. The training process may tune weighting matrices $W^e_X$, $W^e_h$, $W^e_Y$, $W^d_X$, $W^d_h$, $W^d_Y$ such that the difference between the source workload ($C_1$, $C_2$, ..., $C_N$) and the recovered workload ($\hat{C}_1$, $\hat{C}_2$, ..., $\hat{C}_N$) is minimized. Different optimization algorithms such as Gradient descent, RMSProp, Adam, etc. may be used in the training process. The model may have two hyperparameters N and d. N represents the number of RBs in the encoder and decoder and d represents the dimension of target compact workload representation vector R.

Figure 8:
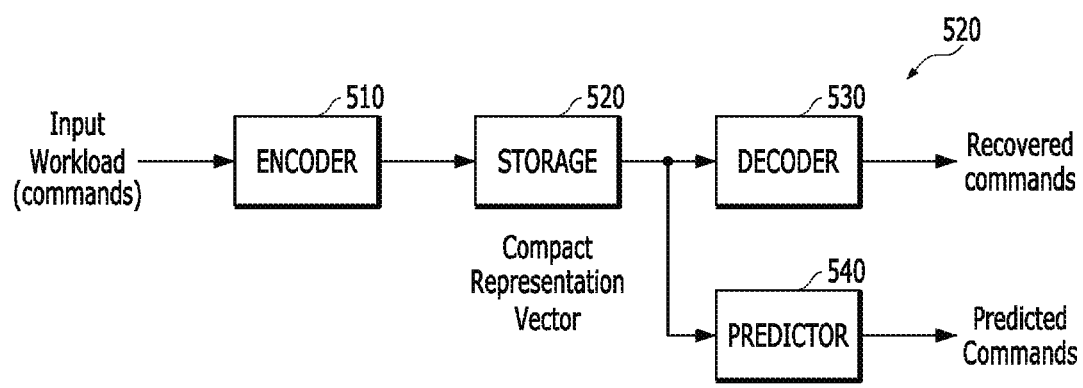
FIG. 8 is a diagram illustrating a recurrent neural network coder in accordance with an embodiment of the present invention.

FIG. 8 is a diagram illustrating a recurrent neural network coder 500 in accordance with an embodiment of the present invention.

Referring to FIG. 8, the recurrent neural network coder 500 may include a predictor 540 in addition to the encoder 510, the storage 520 and the decoder 530 in FIG. 5. The predictor 540 may predict the next K commands following the input workload and generate predicted commands.

Figure 9:
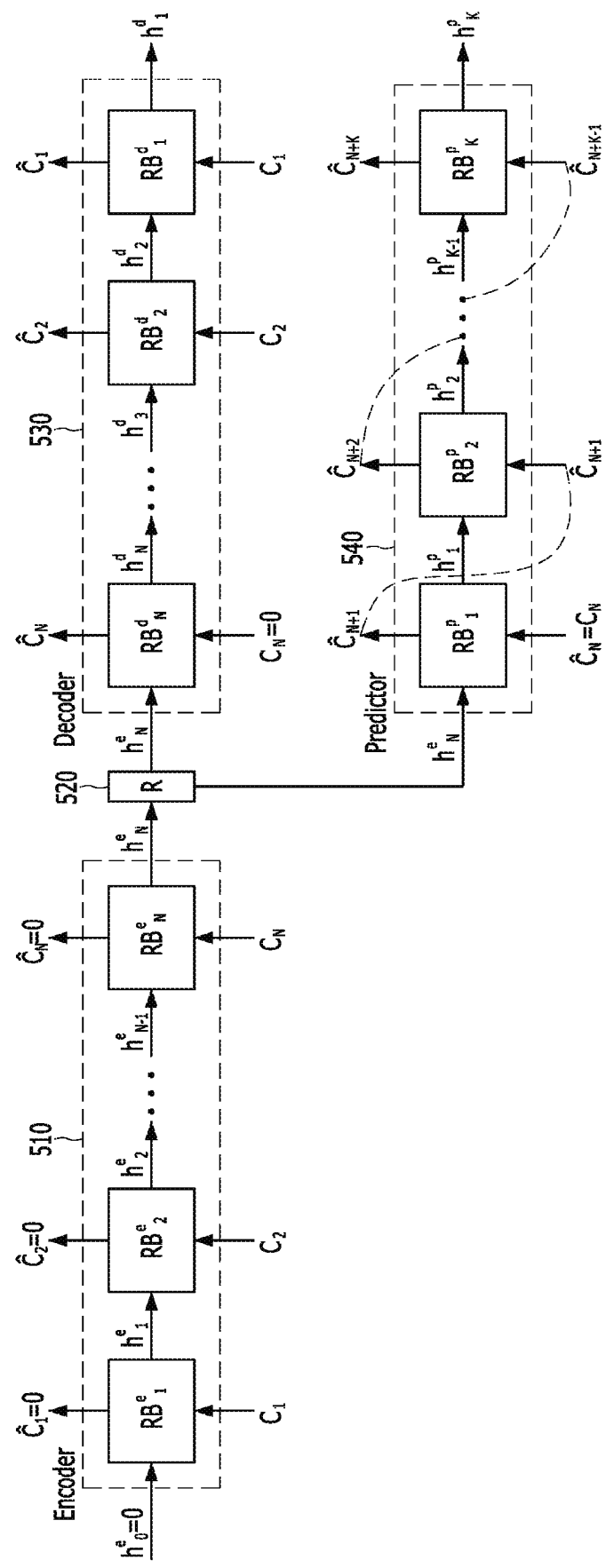
FIG. 9 is a diagram illustrating details of a recurrent neural network coder of FIG. 8.

FIG. 9 is a diagram illustrating details of a recurrent neural network coder 500 of FIG. 8. The encoder 510 and the decoder 530 in the recurrent neural network coder 500 may have the same structure as shown in FIG. 7.

Referring to FIG. 9, the predictor 540 may include a plurality of recurrent predicting blocks $RB^p_1$-$RB^p_K$. The predictor 540 may receive the compact representation vector R and generate predicted commands $\hat{C}_{N+1}$-$\hat{C}_{N+K}$ based on the compact representation vector R and a last input command $C_N$ among the plurality of input commands.

The plurality of recurrent predicting blocks may include first to last predicting blocks $RB^p_1$-$RB^p_K$, which have a cascade connection structure in ascending order, i.e., from first to last predicting blocks.

The first predicting block $RB^p_1$ is configured to: receive a last input command $C_N$ among the plurality of input commands and the compact representation vector R from the storage 520; perform the activation function $f$ on a combination of the last input command $\hat{C}_N (=C_N)$ and a first weight matrix $W^p_X$ to generate a first vector $f(\hat{C}_N W^p_X)$; perform the activation function on a combination of the compact representation vector R $(=h^e_N)$ and a second weight matrix $W^p_h$ to generate a second vector $f(h^e_N W^p_h)$; perform the activation function on a sum of the first and second vectors to generate a first hidden state vector $h^p_1$; and perform the activation function on a combination of the first hidden state vector $h^p_1$ and a third weight matrix $W^p_Y$ to generate a first output vector $\hat{C}_{N+1}$ as a first predicted command following the last input command.

The second predicting block $RB^p_2$ is configured to: receive the first predicted command $\hat{C}_{N+1}$ and the first hidden state vector $h^p_1$; perform the activation function $f$ on a combination of the first predicted command $\hat{C}_{N+1}$ and the first weight matrix $W^p_X$ to generate a third vector $f(\hat{C}_{N+1} W^p_X)$; perform the activation function on a combination of the first hidden state vector $h^p_1$ and a second weight matrix $W^p_h$ to generate a fourth vector $f(h^p_1 W^p_h)$; perform the activation function on a sum of the third and fourth vectors to generate a second hidden state vector $h^p_2$; and perform the activation function on a combination of the second hidden state vector $h^p_2$ and the third weight matrix $W^p_Y$ to generate a second output vector $\hat{C}_{N+2}$ as a second predicted command following the first predicted command $\hat{C}_{N+1}$.

Remaining predicting blocks among the plurality of recurrent predicting blocks may perform operations similar to the first predicting block $RB^p_1$ and the second predicting block $RB^p_2$. The last predicting block $RB^p_K$ among the plurality of recurrent predicting blocks may generate a final hidden state vector $h^p_K$.

As such, the predictor 540 requires additional K RBs and weight matrices $W^p_X$, $W^p_h$, $W^p_Y$. In some embodiments, weight matrices $W^p_X$, $W^p_h$, $W^p_Y$ are the same as or different from weight matrices $W^e_X$, $W^e_h$, $W^e_Y$, respectively. The output of the predictor 540 is K next commands $\hat{C}_{N+1}$-$\hat{C}_{N+K}$ following commands of the input workload $C_1$-$C_N$. Each predicted command is fed into the next RB as an input command. As a result, the next K commands $\hat{C}_{N+1}$-$\hat{C}_{N+K}$ following the input workload are predicted and generated.

Examples of implementation of the recurrent neural network (RNN) coder in accordance with embodiments are described below.

It is noted that the recurrent neural network (RNN) coder for compact workload representation has been implemented using long short-term memory (LSTM) recurrent blocks and tested on the data set containing M=900 synthetic workloads N=10,000 commands each.

The data set has 9 types (100 samples each) of workloads which are generated based on two parameters: queue depth (QD) and read/write ratio (RWR) which represents the ratio of read and write commands in the workload. All workloads are random and 9 workload types are shown in List2:

| | List2: |
|---|---|
| 1. | $W_1$: QD = 1, RWR = 0/100; |
| 2. | $W_2$: QD = 1, RWR = 100/0; |
| 3. | $W_3$: QD = 1, RWR = 70/30; |
| 4. | $W_4$: QD = 32, RWR = 0/100; |
| 5. | $W_5$: QD = 32, RWR = 100/0; |
| 6. | $W_6$: QD = 32, RWR = 70/30; |
| 7. | $W_7$: QD = 256, RWR = 0/100; |
| 8. | $W_8$: QD = 256, RWR = 100/0; |
| 9. | $W_9$: QD = 256, RWR = 70/30. |

Figure 10:
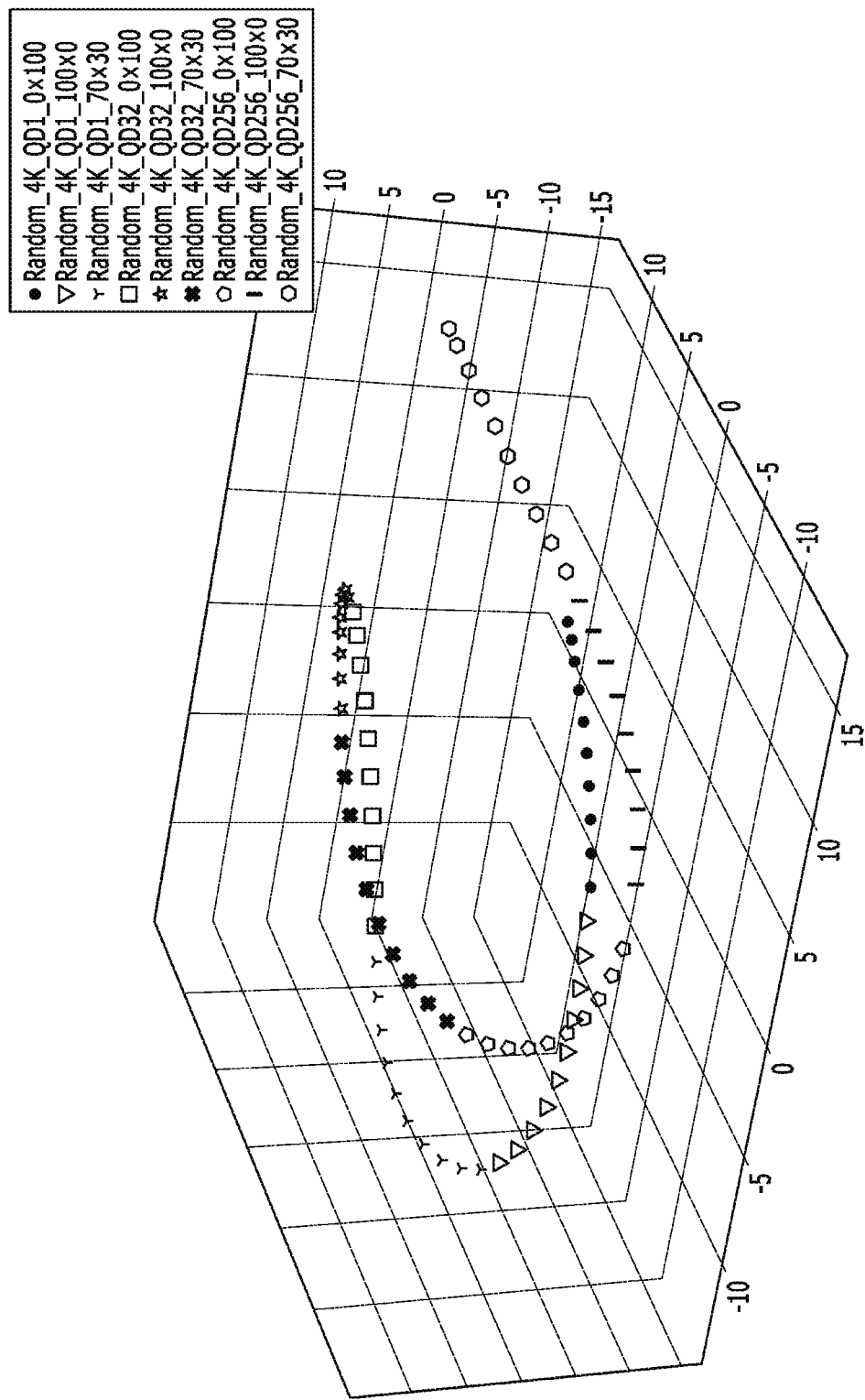
FIG. 10 is a diagram illustrating data set of workloads which are compacted and visualization by a recurrent neural network coder in accordance with an embodiment of the present invention.

The workloads in the data set have been represented as d=25-dimensional vectors. These vectors have been processed by a dimensionality reduction algorithm (e.g., t-SNE algorithm) in order to visualize them in the three-dimensional (3-D) space. One implementation of t-SNE algorithm is described in Laurens van der Maaten, and Geoffrey Hinton, "Visualizing Data using t-SNE," Journal of Machine Learning Research 9, pp. 2579-2605, 2008. For clarity, only 90 points have been plotted (10 from each workload type) as another 810 points would prevent graphical separation between points due to high density for each workload type. The data set of workloads which are compacted and visualization by a recurrent neural network coder is shown in FIG. 10.

Examples of workloads are transformed into 25-dimensional vectors, i.e., compact representation vectors as shown in List3:

| List3: |
|---|
| (1) 10,000 write commands are transformed into 25-dimensional vector: |
| (0.0023, 0.0042, 0.0030, −0.0066, 0.0054, −0.0035, 0.0048, −0.0012, 0.0034, −0.0031, 0.0025, −0.0019, −0.0013, −0.0027, 0.0050, 0.0012, 0.0009, −0.0052, 0.0104, 0.0002, 0.0029, −0.0038, −0.0013, −0.0014, 0.0052); |
| (2) 10,000 read commands are transformed into 25-dimensional vector: |
| (−0.0829, 0.0229, 0.2397, −0.0881, −0.0459, 0.1007, 0.0949, −0.1598, −0.0834, −0.1811, 0.1496, −0.1687, −0.0400, −0.2110, −0.1181, 0.0155, 0.1705, −0.0608, 0.1010, −0.1452, 0.0617, −0.0981, 0.1380, 0.0215, 0.2057); and |
| (3) 7,000 read commands and 3,000 write commands are transformed into 25-dimensional vector: |
| (−0.0993, 0.0165, 0.2955, −0.1090, −0.0515, 0.1226, 0.1119,−0.1978, −0.1000, −0.2293, 0.1806, −0.2162, −0.0507, −0.2742, −0.1377, 0.0184, 0.2138, −0.0817, 0.1382, −0.1815, 0.0666, −0.1220, 0.1749, 0.0192, 0.2506). |

The average Euclidean distance between the centers of each workload type is presented in Table 1:

TABLE 1

|       | $W_1$  | $W_2$  | $W_3$  | $W_4$  | $W_5$  | $W_6$  | $W_7$  | $W_8$  | $W_9$  |
|-------|--------|--------|--------|--------|--------|--------|--------|--------|--------|
| $W_1$ | 0.0000 | 0.7894 | 0.5607 | 0.0005 | 0.7894 | 0.5908 | 0.0003 | 0.7893 | 0.5800 |
| $W_2$ | 0.7894 | 0.0000 | 0.2307 | 0.7894 | 0.0002 | 0.2002 | 0.7894 | 0.0002 | 0.2109 |
| $W_3$ | 0.5607 | 0.2307 | 0.0000 | 0.5607 | 0.2307 | 0.0305 | 0.5607 | 0.2307 | 0.0199 |
| $W_4$ | 0.0005 | 0.7894 | 0.5607 | 0.0000 | 0.7894 | 0.5908 | 0.0002 | 0.7894 | 0.5800 |
| $W_5$ | 0.7894 | 0.0002 | 0.2307 | 0.7894 | 0.0000 | 0.2002 | 0.7894 | 0.0001 | 0.2109 |
| $W_6$ | 0.5908 | 0.2002 | 0.0305 | 0.5908 | 0.2002 | 0.0000 | 0.5908 | 0.2002 | 0.0108 |
| $W_7$ | 0.0003 | 0.7894 | 0.5607 | 0.0002 | 0.7894 | 0.5908 | 0.0000 | 0.7894 | 0.5800 |
| $W_8$ | 0.7893 | 0.0002 | 0.2307 | 0.7894 | 0.0001 | 0.2002 | 0.7894 | 0.0000 | 0.2102 |
| $W_9$ | 0.5800 | 0.2109 | 0.0199 | 0.5800 | 0.2109 | 0.0108 | 0.5800 | 0.2102 | 0.0000 |

As shown in FIG. 10 and Table 1, workloads are mostly separated by certain read/write ratios (RWRs). For example, ($W_1$, $W_4$, $W_7$) are separated by RWR=0/100, ($W_2$, $W_5$, $W_8$) are separated by RWR=100/0, and ($W_3$, $W_6$, $W_9$) are separated by RWR=70/30. Last group ($W_3$, $W_6$, $W_9$) is more diverse and a queue depth feature is more influential. Thus, it can be seen that the compact workload representation scheme in accordance with embodiments may separate workloads by important features and estimate the difference between input workloads in NAND flash devices.

As described above, embodiments may provide a coder (i.e., encoder and decoder) for compact representation of an input workload, and an encoding and decoding method thereof. This implementation is described in U.S. patent application Ser. No. 17/173,378, entitled "COMPACT WORKLOAD REPRESENTATION OF MEMORY SYSTEM" which is incorporated by reference herein in its entirety.

Further, embodiments provide a scheme for a memory controller capable of being aware of input workloads based on a compact representation for input workloads in a memory system (e.g., SSD such as NAND flash memory devices). This scheme is described with FIGS. 11 to 14 below.

Figure 11:
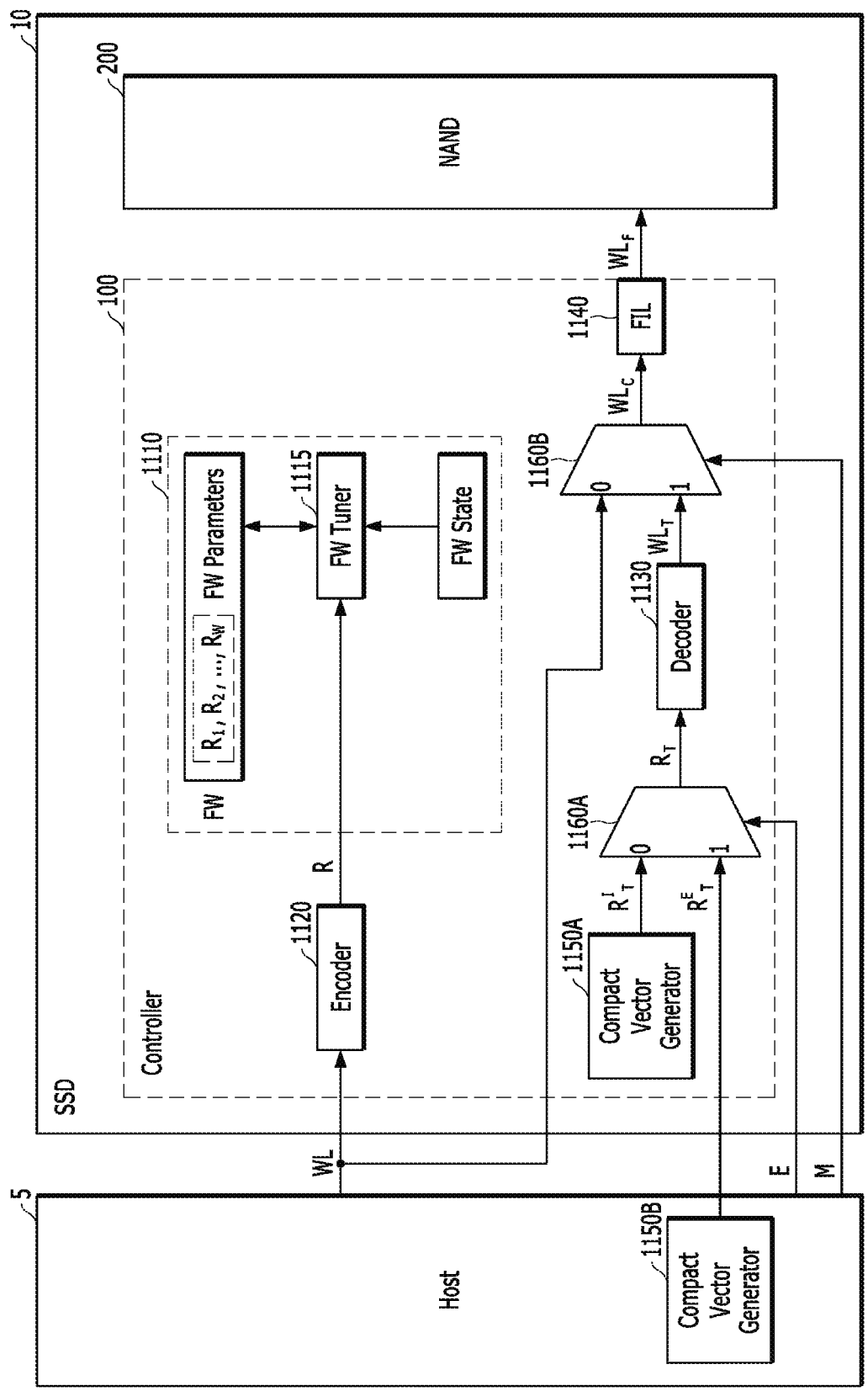
FIG. 11 is a diagram illustrating a data processing system including a memory system in accordance with an embodiment of the present invention.

FIG. 11 is a diagram illustrating a data processing system including a memory system 10 in accordance with an embodiment of the present invention. By way of example and without any limitation, the memory system 10 may include a controller 100 as a workload-aware NAND flash controller with a self-testing block.

Referring to FIG. 11, the data processing system may include a host 5 and the memory system 10. The memory system 10 may include the controller 100 and a memory device 200. In some embodiments, the memory system 10 may be a solid state drive (SSD) including a NAND flash memory device as the memory device 200.

The controller 100 may include a flash translation layer 1110, an encoder 1120 and a decoder 1130. The encoder 1120 and the decoder 1130 may be utilized to implement a workload-aware NAND flash controller with a self-testing block, as elements of the recurrent neural network coder 500 in FIG. 5, which represents workload as a compact vector as described above.

Based on these components, the controller 100 may be able to change firmware (FW) parameters based on the workload type. Since workload representation is compact, embodiments may be helpful in the estimation of a testing coverage of the memory system. The dimension of the workload vector representation is much smaller than the initial workload. Thus, the number of points in low-dimensional space may be used as a coverage metric.

The recurrent neural network coder 500 may operate in a training mode or an inference mode. In an initial stage (i.e., the training mode), the recurrent neural network coder 500 may be trained using a data set of possible workload types covering typical drive operation scenarios. Then weight matrices of the model associated with the recurrent neural network coder 500 and compact representations of typical workloads may be stored in a storage (e.g., a DRAM) or a memory device (e.g., NAND). The training mode may be performed offline using an external compute engine. In the inference mode, the recurrent neural network coder 500 may process input workload using the weight matrices. Essential FW parameters (e.g., garbage collection algorithm, read voltage thresholds, error correction schemes, etc.) may be changed based on compact workload representation and FW state (e.g., the value of counters, used over-provisioning memory, the number of bad blocks, etc.). The self-testing algorithm may be based on the generation of compact workload vectors and transforming them into the commands internally in the controller. As a result, the low-dimensional space of the compact workloads representation may be covered with a better diversity.

In some embodiments, the flash translation layer 1110 may include a firmware (FW) tuner 1115 which is coupled to the encoder 1120. The controller 100 may include a compact vector generator 1150A, a first selector 1160A, a second selector 1160B and a flash interface layer (FIL) 1140, which are directly or indirectly coupled to the decoder 1130. Further, a compact vector generator 1150B may be included in the host 5, which corresponds to the compact vector generator 1150A. Each of the first selector 1160A and the second selector 1160B may be implemented with a multiplexer (MUX). The encoder 1120 and the decoder 1130 may be implemented with recurrent blocks as shown in FIGS. 12 and 13.

Figure 12:
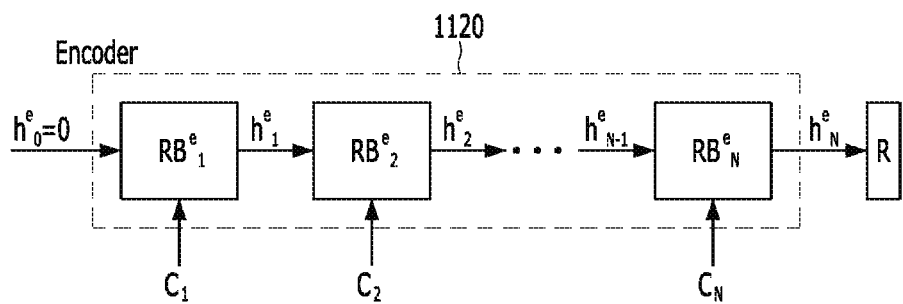
FIG. 12 is a diagram illustrating an encoder in accordance with an embodiment of the present invention.
Figure 13:
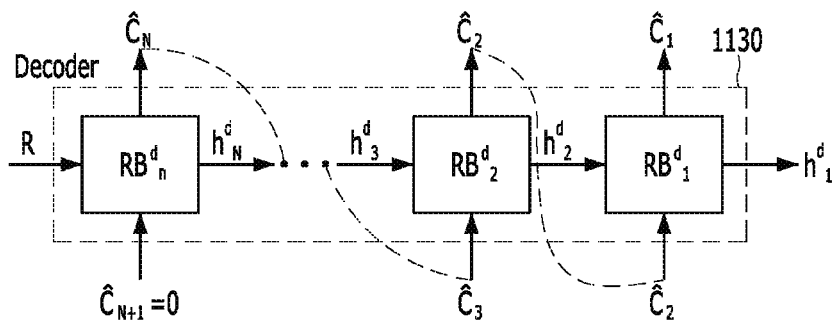
FIG. 13 is a diagram illustrating a decoder in accordance with an embodiment of the present invention.

FIG. 12 is a diagram illustrating an encoder 1120 in accordance with an embodiment of the present invention. By way of example and without any limitation, the encoder 1120 may be utilized to implement a workload-aware NAND flash controller with a self-testing block, as shown in FIG. 11.

Referring to FIG. 12, the encoder 1120 may include a plurality of recurrent encoding blocks $RB^e_1$-$RB^e_N$. Each recurrent encoding block is configured to receive one input command $C_i$ of the plurality of input commands, and generate a hidden state vector $h^e_i$ corresponding to the received input command by applying the set of activation functions f on the received input command. The last encoding block $RB^e_N$ among the plurality of recurrent encoding blocks may generate a final hidden state vector $h^e_N$ as the compact representation vector R corresponding to the plurality of input commands.

In the illustrated example of FIG. 12, the first encoding block $RB^e_1$ is configured to: receive a first input command $C_1$ among the plurality of input commands; perform the activation function f on a combination of the first input command $C_1$ and a first weight matrix $W^e_X$ to generate a first vector $f(C_1 W^e_X)$; perform the activation function on a combination of an initial hidden state vector $h^e_0$ and a second weight matrix $W^e_h$ to generate a second vector $f(h^e_0 W^e_h)$; and perform the activation function on a sum of the first and second vectors to generate a first hidden state vector $h^e_1$. In some embodiments, the initial hidden state vector $h^e_0$ may have a value of 0.

The second encoding block $RB^e_2$ is configured to: receive a second input command $C_2$ among the plurality of input commands; perform the activation function f on a combination of the second input command $C_2$ and the first weight matrix $W^e_X$ to generate a third vector $f(C_2 W^e_X)$; perform the activation function on a combination of the first hidden state vector $h^e_1$ and the second weight matrix $W^e_h$ to generate a fourth vector $f(h^e_1 W^e_h)$; and perform the activation function on a sum of the third and fourth vectors to generate a second hidden state vector $h^e_2$.

Remaining encoding blocks among the plurality of recurrent encoding blocks may perform operations similar to the first encoding block $RB^e_1$ and the second encoding block $RB^e_2$. The last encoding block $RB^e_N$ among the plurality of recurrent encoding blocks may generate a final hidden state vector $h^e_N$ as the compact representation vector R.

As mentioned above, the encoder 1120 may include N recurrent blocks ($RB^e_i$, $1 \leq i \leq N$) with two inputs (i.e., command $C_i$ and hidden state from the previous block $h^e_{i-1}$), and one output (i.e., hidden state of the current block $h^e_i$). In some embodiments, each command $C_i$ may be a tuple of two integer numbers, namely Type of a command ($T_i$) and Logic Block Address ($LBA_i$), and hidden state $h^e_i$ may be a floating-point vector containing H numbers. The hidden state of $RB^e_N$ (i.e., $h^e_N$) may be stored in a storage (e.g., register) which can store d floating-point numbers. Recurrent blocks may be implemented as a simple recurrent neural unit, a gated recurrent unit (GRU), a long short-term memory (LSTM), etc. The encoder 1120 may be implemented both in software (SW) (or firmware (FW)) and hardware (as part of the controller). Workload commands $C_1, C_2, \ldots, C_N$ may be stored in the storage (e.g., a shift register) in order to change compact workload representation R as soon as a new command is received from the host.

FIG. 13 is a diagram illustrating a decoder 1130 in accordance with an embodiment of the present invention. By way of example and without any limitation, the decoder 1130 may be utilized to implement a workload-aware NAND flash controller with a self-testing block, as shown in FIG. 11.

Referring to FIG. 13, the decoder 1130 may receive the compact representation vector R from the storage 1120 and generate recovered commands $\hat{C}_1$-$\hat{C}_N$ based on the compact representation vector R.

The structure of the decoder 1130 may be symmetric to the encoder 1120 but have a cascade connection structure in the opposite order. That is, the plurality of recurrent decoding blocks includes first to last decoding blocks, which are symmetric to the first to last encoding blocks and have a cascade connection structure in descending order. Specifically, the last decoding block $RB^d_N$ among the plurality of decoding blocks $RB^d_1$-$RB^d_N$ may be positioned in the first position of the decoder 1130 and the first decoding block $RB^d_1$ may be positioned in the last position of the decoder 1130. In some embodiments, weight matrices $W^d_X$, $W^d_h$, $W^d_Y$ are the same as or different from weight matrices $W^e_X$, $W^e_h$, $W^e_Y$, respectively.

In the illustrated example of FIG. 13, the last decoding block $RB^d_N$ is configured to: receive an input command $\hat{C}_{N+1}$ and the compact test vector R; perform the activation function f on a combination of the input command $\hat{C}_{N+1}$ and a first weight matrix $W^d_X$ to generate a first vector $f(\hat{C}_{N+1} W^d_X)$; perform the activation function on a combination of the compact test vector R and a second weight matrix $W^d_h$ to generate a second vector $f(R W^d_h)$; perform the activation function on a sum of the first and second vectors to generate a last hidden state vector $h^d_N$; and perform the activation function on a combination of the last hidden state vector $h^d_N$ and a third weight matrix $W^d_Y$ to generate a last output vector $\hat{C}_N$. In some embodiments, the input command $\hat{C}_{N+1}$ may have a value of 0.

The second decoding block $RB^d_2$ is configured to: receive a third output vector $\hat{C}_3$ and a third hidden state vector $h^d_3$ from a third decoding block $RB^d_3$; perform the activation function f on a combination of the third output vector $\hat{C}_3$ and the first weight matrix $W^d_X$ to generate a third vector $f(\hat{C}_3 W^d_X)$; perform the activation function on a combination of the third hidden state vector $h^d_3$ and the second weight matrix $W^d_h$ to generate a fourth vector $f(h^d_3 W^d_h)$; perform the activation function on a sum of the third and fourth vectors to generate a second hidden state vector $h^d_2$; and perform the activation function on a combination of the second hidden state vector and the third weight matrix $W^d_Y$ to generate a second output vector $\hat{C}_2$.

The first decoding block $RB^d_1$ is configured to: receive the second output vector $\hat{C}_2$ and the second hidden state vector $h^d_2$ from the second decoding block $RB^d_2$; perform the activation function f on a combination of the second output vector $\hat{C}_2$ and the first weight matrix $W^d_X$ to generate a fifth vector $f(\hat{C}_2 W^d_X)$; perform the activation function on a combination of the second hidden state vector $h^d_2$ and the second weight matrix $W^d_h$ to generate a sixth vector $f(h^d_2 W^d_h)$; perform the activation function on a sum of the fifth and sixth vectors to generate a first hidden state vector $h^d_1$; and perform the activation function on a combination of the first hidden state vector and the third weight matrix $W^d_Y$ to generate a first output vector $\hat{C}_1$. The first to last output vectors $\hat{C}_1$-$\hat{C}_N$ may be recovered commands corresponding to the input commands $C_1$-$C_N$.

As mentioned above, the decoder 1130 may have N RBs with extra output to recover commands from the compact representation vector R. Each block $RB^d_i$ ($1 \leq i \leq N$) may receive a hidden state vector from the previous block $h^d_{i+1}$ and recovered command $\hat{C}_{i+1}$ as inputs, and may generate a current hidden state vector $h^d_i$ and a recovered command $\hat{C}_i$. The decoder 1130 may operate in a way opposite to the encoder 1120, i.e., may recover commands from the last output vector $\hat{C}_N$ to the first output vector $\hat{C}_1$.

The encoder 1120 and the decoder 1130 in FIGS. 12 and 13 may be utilized to implement the workload-aware NAND flash controller with a self-testing block as shown in FIG. 11.

Referring back to FIG. 11, the controller 100 may provide tuning of FW parameters (e.g., garbage collection intensity) and drive self-testing using the encoder 1120 and the decoder 1130, respectively.

The encoder 1120 may process the input workload WL including N commands $C_1$-$C_N$, which is transformed to the d-dimensional compact representation vector R. This vector may be passed to the FW tuner 1115. The FW tuner 1115 may change (or tune) FW parameters based on FW State (e.g., wear-out level, counter values, etc.) and input workload type. The workload type may be determined based on a distance function between the input vector R and stored W typical workload vectors $(R_1, R_2, \ldots, R_W)$. In some embodiments, the distance function may be the Euclidean distance. As is well known, the Euclidean distance between two n-dimensional vectors p and q may be defined as the following equation: $d(p,q) = \sqrt{(q-p)^2}$ or $$d(p, q) = \sqrt{\sum_{i=1}^{n}(q_i - p_i)^2}.$$

The FW tuner 1115 may update parameters based on a cost function that may be determined to maximize the performance of SSD and/or minimize power consumption in the SSD.

Two typical workloads may be read-intensive and write-intensive. For these types of workloads, the flash translation layer 1110 may store two compact 5-dimensional (d=5) vectors: $R_1$=(0.0617, −0.0981, 0.1380, 0.0215, 0.2057) and $R_2$=(0.0029, −0.0038, −0.0013, −0.0014, 0.0052) correspondingly. For example, in the case of read-intensive workloads, garbage collection (GC) intensity may be set to the maximal level, whereas in the case of write-intensive workloads, the GC intensity may be set to the minimal level.

In an example, the input workload WL contains 5 read commands and 95 write commands and is transformed to 5-dimensional vector R=(0.0034, −0.0031, 0.0025, −0.0019, −0.0013) by the encoder 1120. The Euclidean distance between R and $R_1$ is 0.2723 and the Euclidean distance between R and $R_2$ is 0.0076. Therefore, the input workload WL may be determined as write-intensive as the vector R is closer to the vector $R_2$. Based on this determination, the FW tuner 1115 may set GC intensity to the minimal level in order to provide a better performance by minimizing time-consuming GC operations.

The decoder 1130 may provide a drive self-test. The decoder 1130 may receive the compact representation vector $R_T$ produced by a compact vector generator and may recover test workload $WL_T$ from the compact representation vector $R_T$. In an embodiment, the compact vector generator may be implemented as an internal component 1150A of the controller 100. In another embodiment, the compact vector generator may be implemented as an internal component 1150B of the host 5, i.e., the external component 1150B of the controller 100.

The selector 1160A may receive the compact representation vector $R'_T$ from the compact vector generator 1150A and the compact representation vector $R^E_T$ from the compact vector generator 1150B in response to a vector selection signal E. For example, when E='0', the selector 1160A may receive the compact representation vector $R'_T$ from the compact vector generator 1150A and output the compact representation vector $R_T$. When E='1', the selector 1160A may receive the compact representation vector $R^E_T$ from the compact vector generator 1150B and output the compact representation vector $R_T$.

The decoder 1130 may receive the compact representation vector $R_T$ from the selector 1160A, decode the compact representation vector $R_T$ and output the test workload $WL_T$. The selector 1160B may receive input workload WL from the host 5 and the test workload $WL_T$ from the decoder 1130 in response to a mode selection signal M. For example, when M='0', the selector 1160B may receive the input workload WL from the host 5 and output workload $WL_C$. When M='1', the selector 1160B may receive the test workload $WL_T$ from the decoder 1130 and output workload $WL_C$. The SSD 10 supports two modes including an ordinary mode (M='0') and a testing mode (M='1'). In the ordinary mode, the workload $WL_C$ is the same as the host workload WL. In the testing mode, the test workload $WL_T$ is decoded from the compact representation vector $R_T$ produced by the compact vector generator 1150A or 1150B.

The flash interface layer (FIL) 1140 may receive the workload $WL_C$ from the selector 1160B and produce a final workload $WL_F$. The final workload $WL_F$ may be passed to the NAND memory device 200 from the FIL 1140. Since compact vectors $R_T$ have much lower dimensionality compared to the input workloads WL, fewer vectors are required to cover possible test space.

Figure 14:
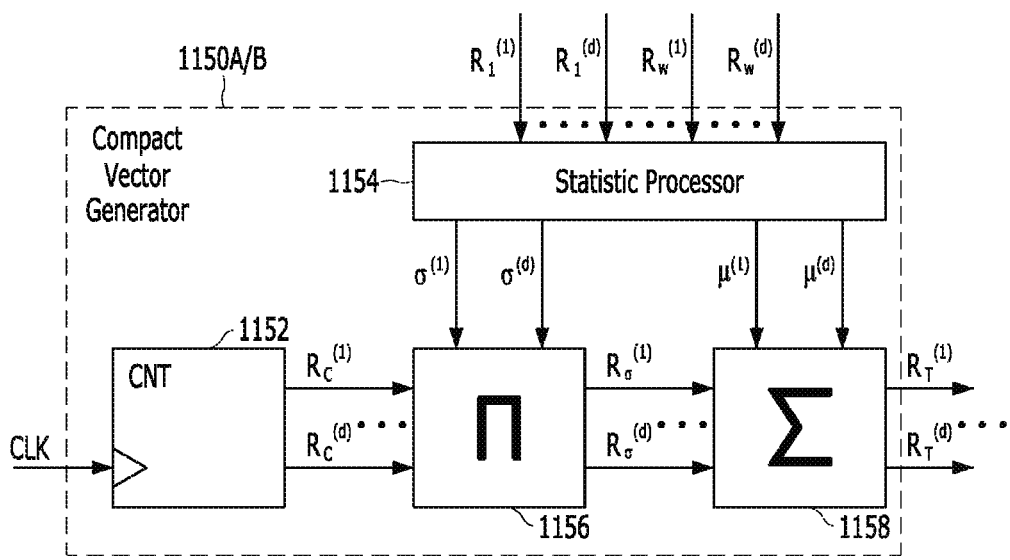
FIG. 14 is a diagram illustrating a compact vector generator in accordance with an embodiment of the present invention.

FIG. 14 is a diagram illustrating a compact vector generator 1150 in accordance with an embodiment of the present invention. The compact vector generator 1150 may be the compact vector generator 1150A or the compact vector generator 1150B in FIG. 11.

Referring to FIG. 14, the compact vector generator 1150 may include a counter (CNT) 1152, a statistic processor 1154, a product component (π) 1156 and a summation component (Σ) 1158. The counter (CNT) 1152 may generate multi-dimensional compact vectors in response to a clock CLK. For example, the counter (CNT) 1152 may generate d-dimensional compact vectors $R_C^{(1)}$-$R_C^{(d)}$. The statistic processor 1154 may receive components of W typical workload vectors $R_1$-$R_W$ and generate standard deviation values $\sigma^{(i)}$ and mean values $\mu^{(i)}$ for all typical workload vectors $R_1$-$R_W$. For example, the statistic processor 1154 may receive components $R_1^{(1)}$-$R_1^{(d)}$ to $R_W^{(1)}$-$R_W^{(d)}$ of W workload vectors $R_1$-$R_W$ and generate standard deviation values $\sigma^{(1)}$-$\sigma^{(d)}$ and mean values $\mu^{(1)}$-$\mu^{(d)}$ for all typical workload vectors $R_1$-$R_W$. The product component (π) 1156 may product the d-dimensional compact vectors $R_C^{(1)}$-$R_C^{(d)}$ with the standard deviation values $\sigma^{(1)}$-$\sigma^{(d)}$ to generate compact vectors $R\sigma^{(1)}$-$R\sigma^{(d)}$, respectively. The summation component (Σ) 1158 may sum compact vectors $R\sigma^{(1)}$-$R\sigma^{(d)}$ with mean values $\mu^{(1)}$-$\mu^{(d)}$ to generate compact test vectors $R_T^{(1)}$-$R_T^{(d)}$, respectively.

In some embodiments, the compact vector generator 1150 generates all possible 5-dimensional vectors $R_C$ with step 0.2 for each coordinate, i.e., (0, 0, 0, 0, 0), (0, 0, 0, 0, 0.2), (0, 0, 0, 0.2, 0), ..., (1, 1, 1, 1, 1)—7776 vectors in total, which cover possible 5-dimensional test space uniformly. Then, the compact vector generator 1150 transforms each vector $R_C$ as the following equation: $R_C^{(i)} \times \sigma^{(i)} + \mu^{(i)}$, where $R_C^{(i)}$ represents i-th dimension in compact vector, $\sigma^{(i)}$ represents standard deviation of i-th component for all typical workload vectors $R_1, R_2, R_W$, $\mu^{(i)}$ represents mean of i-th component for all typical workload vectors $R_1, R_2, \ldots, R_W$. As a result, d-dimensional compact test vector $R_T$ is generated.

All vectors $R_T$ may be recovered to 7776 workloads $WL_F$ by the decoder 1130 and the FIL 1140. Thus, in the test mode (i.e., M='1'), a pseudo exhaustive drive test may be performed using much fewer test vectors in comparison to a test in the ordinary mode (i.e., M='0').

Estimated hardware, latency, and memory overheads are summarized in Table 2:

TABLE 2

| N | Memory (Kb) | Latency (μs) | Hardware (LUT/FF) |
|---|---|---|---|
| 100 | 40 | 0.69 | (5626, 10125) |
| 1000 | 40 | 6.72 | (56260, 101250) |
| 10000 | 40 | 66.69 | (562600, 1012500) |

The case of Table 2 indicates that recurrent neural network blocks (RBs) for the encoder and the decoder are implemented as long short-term memory (LSTM) blocks. Memory is estimated for storing weight matrices for the encoder and decoder to compress workloads to 25-dimensional vectors (d=25). Since weight matrices are shared between all units, the memory overhead is almost the same for different numbers of LSTM blocks (N). Latency is estimated based on C program implementing encoding and decoding one workload to a 25-dimensional vector. Hardware is estimated for 2N LSTM blocks implemented in field-programmable gate array (FPGA) in look-up table (LUT) blocks and flip-flops (FF).

As described above, embodiments provide a scheme to use a compact representation vector associated with input workloads. In an embodiment, a memory controller may be capable of being aware of input workloads based on a compact representation for input workloads in a memory system (e.g., SSD such as NAND flash memory devices) and may perform an operation (i.e., tuning of firmware parameters) in order to optimize its performance. In another embodiment, a test of a memory system (e.g., SSD test) may be performed with a much smaller test vector space.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the appended claims.

What is claimed is:

1. A system comprising:
    a memory device; and
    a controller including an encoder and firmware (FW) coupled to the encoder including a plurality of recurrent encoding blocks, which include first to last encoding blocks,
    wherein each recurrent encoding block is configured to:
    receive one of a plurality of input commands in an input workload associated with the memory device; and
    generate a hidden state vector corresponding to the received input command by applying a set of activation functions on the received input command,
    wherein the last encoding block generates a final hidden state vector as a compact representation vector corresponding to the plurality of input commands, and
    wherein the firmware is configured to:
    determine and compute a distance function between the compact representation vector and each of multiple compact workload vectors comprising compact representations of input workloads to the system; and
    tune at least one of firmware parameters based on the determined distances.

2. The system of claim 1, wherein the distance function includes Euclidean distance.

3. The system of claim 2, wherein the firmware is configured to:
    select one of the multiple compact workload vectors based on the determined distances, the selected compact workload vector having the lowest distance; and
    tune at least one of the firmware parameters based on the selected compact workload vector.

4. The system of claim 3, wherein the at least one of the firmware parameters includes a garbage collection intensity.

5. The system of claim 1, wherein an activation function among the set of activation functions includes one of a hyperbolic tangent, a sigmoid, and a rectified linear unit, and
    wherein the first to last encoding blocks are connected in cascade.

6. The system of claim 5, wherein the first encoding block is configured to:
    receive a first input command among the plurality of input commands;
    perform the activation function on a combination of the first input command and a first weight matrix to generate a first vector;
    perform the activation function on a combination of an initial hidden state vector and a second weight matrix to generate a second vector; and
    perform the activation function on a sum of the first and second vectors to generate a first hidden state vector.

7. The system of claim 6, wherein a second encoding block among the plurality of recurrent encoding blocks is configured to:
    receive a second input command among the plurality of input commands;
    perform the activation function on a combination of the second input command and the first weight matrix to generate a third vector;
    perform the activation function on a combination of the first hidden state vector and the second weight matrix to generate a fourth vector; and
    perform the activation function on a sum of the third and fourth vectors to generate a second hidden state vector.

8. The system of claim 1, wherein the controller further includes:
    a decoder including a plurality of recurrent decoding blocks and configured to receive a compact test vector and generate a test workload including recovered commands based on the compact test vector, and
    wherein the plurality of recurrent decoding blocks includes first to last decoding blocks, which are symmetric to the first to last encoding blocks and have a cascade connection structure in descending order.

9. The system of claim 8, wherein the plurality of recurrent encoding and decoding blocks are implemented in different ways.

10. The system of claim 8, wherein the last decoding block is configured to:
    receive an input command and the compact test vector;
    perform the activation function on a combination of the input command and a first weight matrix to generate a first vector;
    perform the activation function on a combination of the compact test vector and a second weight matrix to generate a second vector;
    perform the activation function on a sum of the first and second vectors to generate a last hidden state vector; and
    perform the activation function on a combination of the last hidden state vector and a third weight matrix to generate a last output vector.

11. The system of claim 8, wherein the first decoding block is configured to:
    receive a second output vector and a second hidden state vector from a second decoding block;
    perform the activation function on a combination of the second output vector and the first weight matrix to generate a third vector;
    perform the activation function on a combination of the second hidden state vector and the second weight matrix to generate a fourth vector;
    perform the activation function on a sum of the third and fourth vectors to generate a first hidden state vector; and perform the activation function on a combination of the first hidden state vector and the third weight matrix to generate a first output vector,
wherein the recovered commands include the first to last output vectors.

12. The system of claim 8, further comprising:
a compact vector generator configured to generate the compact test vector; and
a selector configured to receive the input workload and the test workload and output a selected workload among the input and test workloads to the memory device.

13. The system of claim 12, wherein the compact vector generator is included in the controller or a host coupled to the controller.

14. A method for operating a controller of a memory system, the method comprising:
providing an encoder and firmware (FW) coupled to the encoder including a plurality of recurrent encoding blocks, which includes first to last encoding blocks;
receiving, by each recurrent encoding block, one of a plurality of input commands in an input workload associated with a memory device;
generating, by each recurrent encoding block, a hidden state vector corresponding to the received input command by applying a set of activation functions on the received input command;
determining, by the firmware, a distance function between a compact representation vector corresponding to the plurality of input commands and each of multiple compact workload vectors comprising compact representations of input workloads to the memory system; and tuning, by the firmware, at least one of firmware parameters based on the determined distances,
wherein the last encoding block generates a final hidden state vector as a compact representation vector.

15. The method of claim 14, wherein the distance function includes Euclidean distance, and
wherein the tuning of the at least one of firmware parameters comprises:
selecting one of the multiple compact workload vectors based on the determined distances, the selected compact workload vector having the lowest distance; and
tuning the at least one of the firmware parameters based on the selected compact workload vector.

16. The method of claim 15, wherein the at least one of the firmware parameters includes a garbage collection intensity.

17. The method of claim 14, wherein an activation function among the set of activation functions includes one of a hyperbolic tangent, a sigmoid, and a rectified linear unit.

18. The method of claim 14, wherein the first to last encoding blocks are connected in cascade.

19. The method of claim 15, further comprising:
receiving, by a decoder including a plurality of recurrent decoding blocks, a compact test vector; and
generating, by the decoder, a test workload including recovered commands based on the compact test vector, and
wherein the plurality of recurrent encoding and decoding blocks are implemented in different ways.

20. The method of claim 19, further comprising:
selecting one of the input workload and the test workload, and outputting the selected workload to the memory device.

* * * * *